US008143900B2

(12) United States Patent
Shimp et al.

(10) Patent No.: US 8,143,900 B2
(45) Date of Patent: Mar. 27, 2012

(54) COMMUNICATION SYSTEM FAULT LOCATION USING SIGNAL INGRESS DETECTION

(75) Inventors: Richard L. Shimp, Harrisonburg, VA (US); Dennis A. Zimmerman, Bridgewater, VA (US)

(73) Assignee: Comsonics, Inc., Harrisonburg, VA (US)

( * ) Notice: Subject to any disclaimer, the term of this patent is extended or adjusted under 35 U.S.C. 154(b) by 906 days.

(21) Appl. No.: 12/183,638

(22) Filed: Jul. 31, 2008

(65) Prior Publication Data
US 2010/0026310 A1 Feb. 4, 2010

(51) Int. Cl.
*G01R 31/08* (2006.01)
*G01R 31/28* (2006.01)
*H04N 7/173* (2011.01)

(52) U.S. Cl. .......................... 324/527; 324/528; 725/125
(58) Field of Classification Search .................. 324/527, 324/528; 725/125
See application file for complete search history.

(56) References Cited

U.S. PATENT DOCUMENTS

| | | | | |
|---|---|---|---|---|
| 5,777,662 | A * | 7/1998 | Zimmerman | 725/125 |
| 2003/0033609 | A1 * | 2/2003 | Zimmerman | 725/125 |
| 2006/0248565 | A1 * | 11/2006 | Shimp et al. | 725/123 |

* cited by examiner

*Primary Examiner* — Amy He
(74) *Attorney, Agent, or Firm* — Whitham, Curtis, Christofferson & Cook, P.C.

(57) ABSTRACT

Detecting ingress of a transmitted signal into a cable communication system due to a radio frequency signal transmitted from a moving vehicle and interrogation of transmitter location over a separate wireless link provides monitoring of shielding integrity or flaws there in a cable communication system. The location of a shielding flaw may then be precisely located in a closed loop fashion without risking overload of the cable communication system or interference with upstream signaling therein by detecting ingress signal strength and controlling transmitted signal strength while providing a user-perceptible indication of ingress signal strength which is compensated for the control of transmitted signal strength and thus indicates proximity of a hand-held instrument or transmitter to said shielding flaw.

23 Claims, 3 Drawing Sheets

COMMUNICATION SYSTEM FAULT LOCATION USING SIGNAL INGRESS DETECTION

BACKGROUND OF THE INVENTION

1. Field of the Invention

The present invention generally relates to communication system condition monitoring and maintenance and, more particularly, to location of shielding faults in cable communication systems by detection of signal ingress into shielded cables of a cable communication system.

2. Description of the Prior Art

Cable communication systems for distribution of television programming and other data services are now familiar and popular in the United States. In recent years, so-called upstream signaling arrangements have also been provided on such systems for providing network (e.g. Internet) access for computers, interactive games and the like. Even more recently, it has been proposed to also provide telephone service over the same communication links as well and many cable service providers are implementing and actively marketing such an additional service.

While such cable communications systems were initially implemented largely with coaxial cable comprising a principal, centrally located signal conductor and a metal shielding layer at or near the periphery of the cable, such distribution systems now commonly use fiber-optics for the principal portion of the distribution network but retain the use of coaxial cable for final distribution to relatively small groups of customers (about 200-1200 customers per group). One of many reasons for such a substitution is that fiber-optic links are not generally subject to signal egress or pick-up of environmental noise while coaxial cable suffers from such effects at any flaw such as an opening or irregularity in the shielding layer. Since the portion of the frequency spectrum used for cable communications overlaps with the frequency band used for aircraft navigation, signal egress from cable communication systems has been a major concern for cable system operators and detection of signal egress has been the mechanism of choice for detecting and locating shielding flaws.

However, signal ingress through such shielding flaws is becoming much more of interest than signal egress for several reasons. Signal egress is currently becoming much less of a problem in regard to interfering with other communications due to the reduction of the extent of use of coaxial cables in cable distribution networks whereas upstream signaling involves use of amplifiers and modulated lasers to couple signals originating the coaxial cable portions of the network into fiber-optic portions of the network and ingress of signals at excessive levels can overload such lasers by driving them into non-linear regions of operation (e.g. saturation) which greatly increases noise while often blocking or at least effectively attenuating the transmission of information-bearing signals (e.g. greatly decreasing the signal to noise ratio (SNR) beyond where information can be reliably communicated) and possibly causing damage to the lasers.

Additionally, increasing use of digital transmission has made egress signals much more difficult to detect since the signals tend to more closely resemble noise and only the carrier signal frequency can be used for reliable detection of signal egress. Moreover, the proposed standards for digital television signal transmission propose a signal format in which the carrier frequency is suppressed, while signal levels are greatly reduced and spread over a frequency band of 2-6 MHZ, depending on the transmitted bit rate; leaving virtually no portion of the signal by which an egress signal can be identified as such even though likelihood of interference from egress signals that has been a concern in the past is reduced. Therefore, ingress of signals into a cable communication system is becoming of increased concern while the importance of signal egress is diminishing.

Nevertheless, signal egress and ingress are symmetrical effects due to the same types of flaws in shielding of the coaxial cables employed in cable communication systems which must be monitored and repaired to maintain communication system efficiency and proper performance. While detection of signal egress has been effective in the past for detection of such flaws, changes in the signals communicated have made it considerably less so and circumstances which may make flaw detection by signal egress detection impractical if not impossible are certainly foreseeable. Conversely, while signal ingress is becoming of much greater importance, the ability to detect shielding flaws through which signal ingress can occur are diminishing while the intentional production of signal ingress has been impractical for a number of reasons (particularly for system maintenance purposes since it does not, itself, provide closed-loop feedback for location of flaws which is available when detecting signal egress) and certainly contraindicated in view of the malfunctions that may be caused in cable communication systems of current designs capable of providing upstream signaling.

SUMMARY OF THE INVENTION

It is therefore an object of the present invention to provide a system and method of providing closed-loop detection and location of shielding flaws in a cable communication system through production of signal ingress in a controlled manner which does not cause malfunction of the cable communication system.

In order to accomplish these and other objects of the invention, a method for locating shielding flaws in a cable communication system is provided comprising steps of monitoring amplitude of radio frequency signals ingressing into a cable communication system and which tends to vary with proximity of a transmitter to a location permitting ingressing of radio frequency signals, communicating a perceptible signal to a user indicating the amplitude, and controlling signal strength of radio frequency signals transmitted in accordance with the monitoring step to limit a level of ingress signal in said cable communication system while compensating the perceptible signal for change of signal strength of radio frequency signals transmitted, whereby the perceptible signal provides an indication of proximity of a transmitter to the location permitting ingress. The cable system can be further monitored by transmitting low duty cycle pulses which may be coded to identify a transmitter while storing locations at times such pulses are transmitted to be interrogated based on a time signal ingress is detected.

In accordance with another aspect of the invention, an apparatus for monitoring a cable communication system is provided including a transmitter for transmitting a radio frequency signal for ingress into the cable communication system, a position locating arrangement for producing location information corresponding to transmission of the signal, and an arrangement for responding to an inquiry upon detection of signal ingress.

In accordance with a further aspect of the invention, an apparatus for locating a shielding flaw in a cable communication system is provided, including an arrangement for transmitting a signal for ingress into a cable communication system, an arrangement for controlling signal strength of said signal responsive to a received signal indicating signal strength of an ingress signal in the cable communication system, and an arrangement for generating a signal perceptible to a user indicating signal strength of the ingress signal in the cable communication system and compensated for changes in signal strength due to changes in transmitted signal strength.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
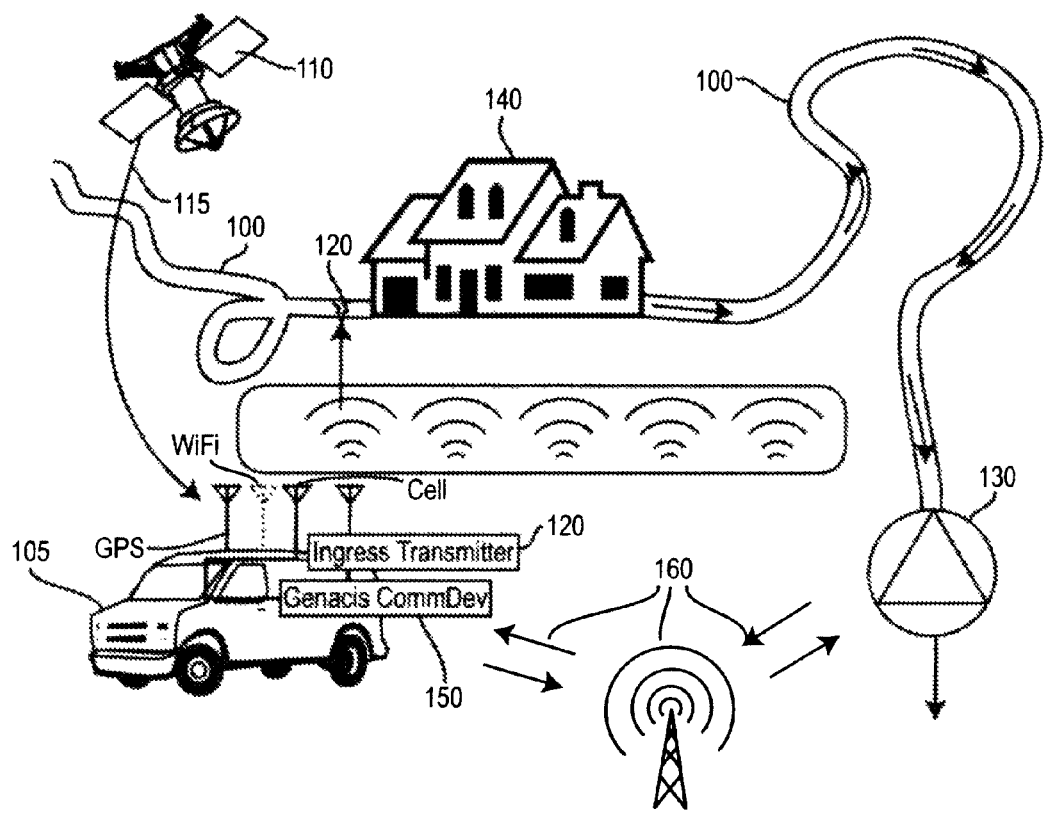
FIGS. 1 and 2 are graphical representation of respective stages of a method of detecting and locating shielding flaws in a cable communication system.
Figure 2:
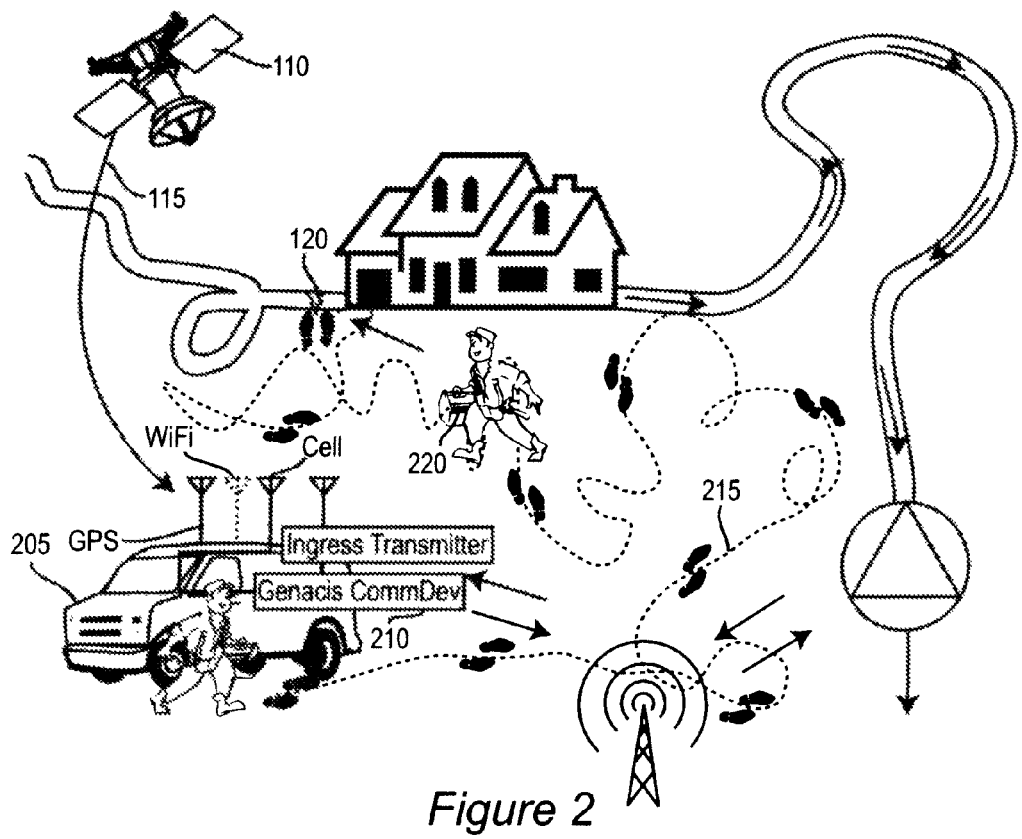

Referring now to the drawings, and more particularly to FIGS. 1 and 2, there is shown a graphical depiction of a detection or monitoring phase and a location and repair phase, respectively, of a method of detecting and remediating shielding flaws in a cable communication system, respectively. More specifically, in FIGS. 1 and 2, a representative portion of a cable communication system and its environment is illustrated including resources included in carrying out the method. Communication links are illustrated generally and schematically in FIGS. 1 and 2 but are illustrated in greater detail in FIG. 3.

Figure 4:
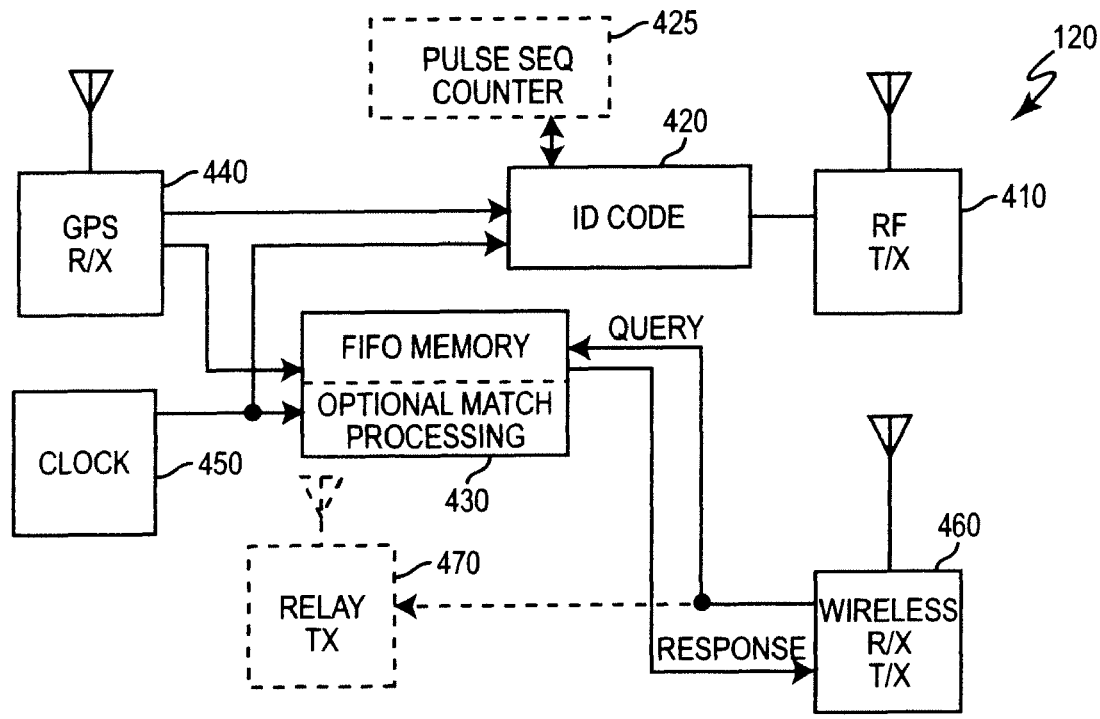
Figure 5:
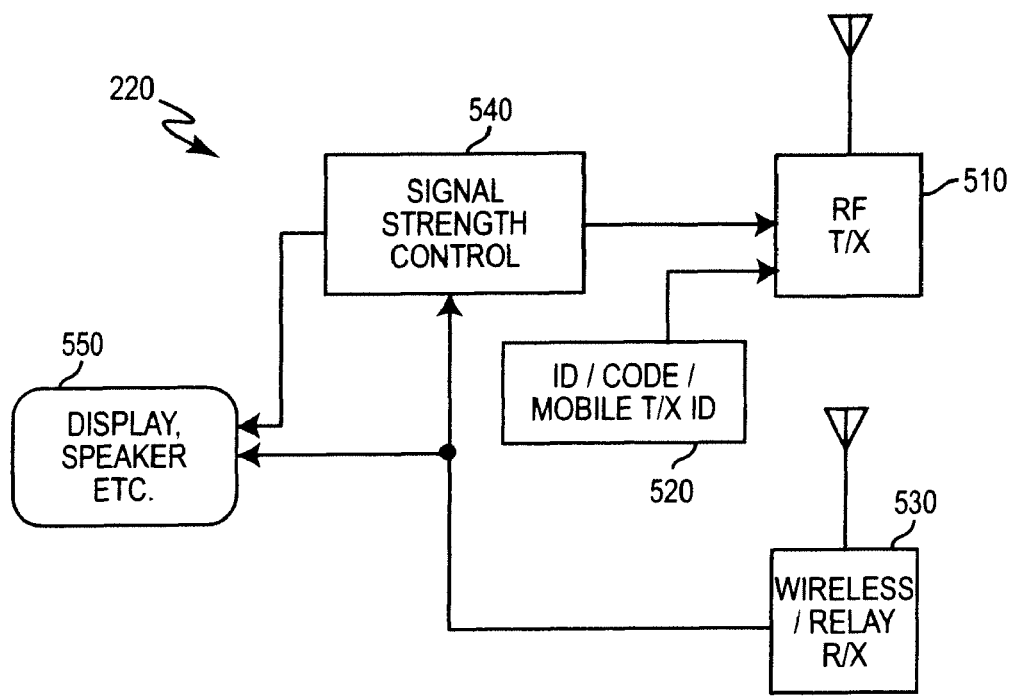

While some particular elements of the cable communication system 100 and the individual resources employed in the method are known (although preferred resources which will be described below in connection with FIGS. 4 and 5 are not), the method in accordance with the invention is represented in the juxtaposition of those elements and resources and thus no portion of either of FIG. 1 or 2 is admitted to be prior art in regard to the invention.

Figure 3:
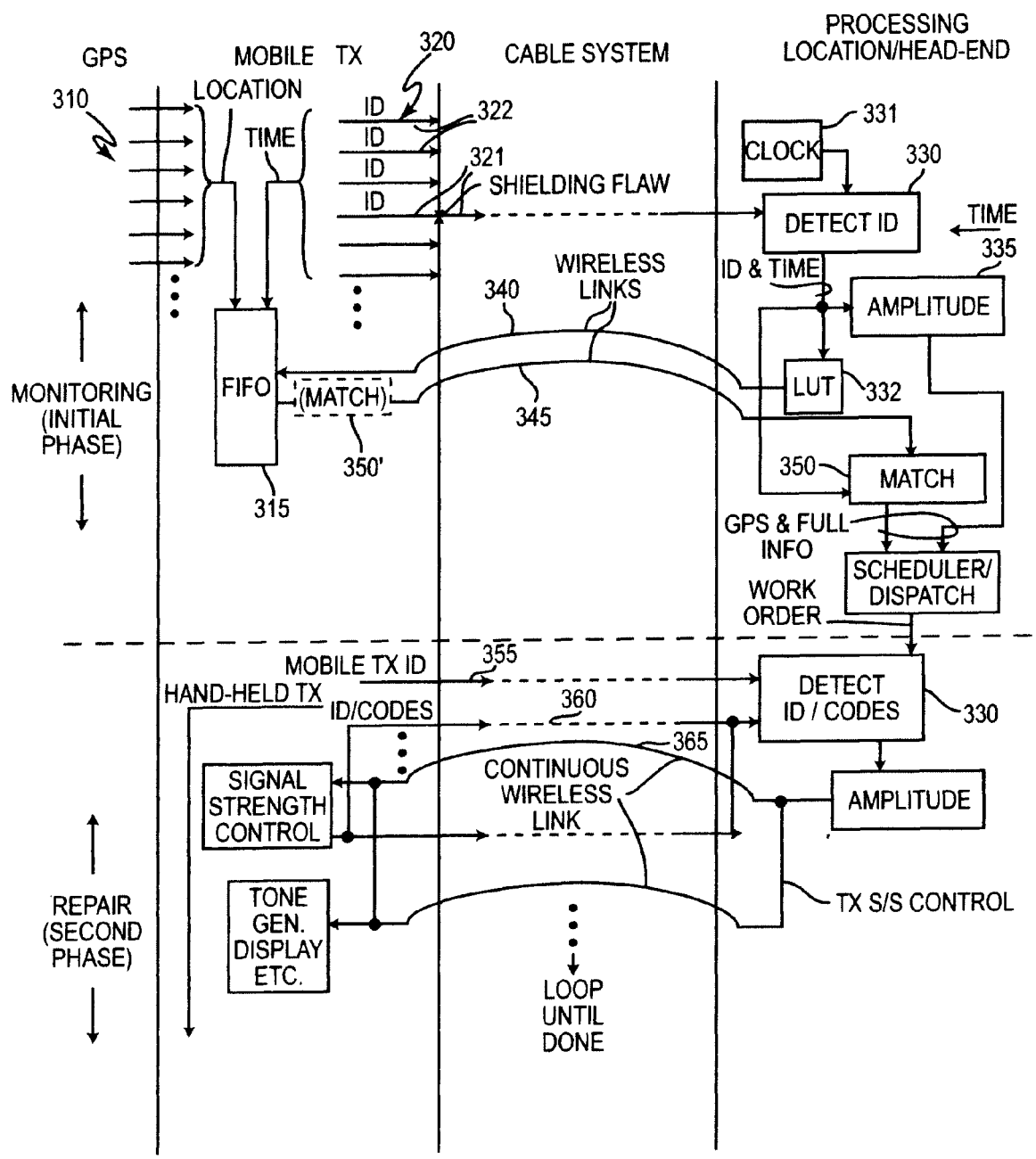
FIG. 3 depicts sequences of communications over particular communication links to carry out the method of FIGS. 1 and 2, and FIGS. 4 and 5 are block diagrams of preferred architectures of ingress signal transmitters of mobile and hand-held types, respectively, which are useful in carrying out the method of FIGS. 1 and 2.

Referring now to FIGS. 1 and 3, a first phase of shielding flaw detection and location will be described. Since cable communication systems are necessarily geographically distributed, it has been found convenient and economical to monitor the system from moving vehicles (e.g. 105) which may be sent to various locations to conduct repairs, equipment installation and other necessary activities of the cable communication system operator. The location of each such vehicle can always be accurately known at the vehicle by means of global positioning systems (GPS—represented by satellite 110 and transmission 115) which are well-known and have become substantially ubiquitous in recent years. Such vehicles equipped with GPS devices have been widely used for monitoring cable communication system signal egress for a number of years.

In accordance with the invention, the vehicle is also equipped with a mobile signal ingress transmitter 120 which is arranged to emit energy pulses encoded with selected information such as identification information and, optionally, other information such as a time stamp, GPS position or the like sufficient to uniquely identify the vehicle or transmitter.

A frequency of 27.47 MHZ is preferred for the transmitted coded pulse and currently permitted by the FCC for such uses. The signal strength of the transmitted coded pulse is preferably set in accordance with both the average proximity of roads the vehicle is likely to use and the severity (or lack thereof) of the shielding flaw to be detected as well as the likelihood of causing interference with other signals or overloading a laser or other element of the cable communication system if the shielding flaw is particularly severe. Signal strength for the transmitted coded pulses is preferably substantially equal or at least similar among the ingress transmitters that may be concurrently in use since some additional information for refining the shielding flaw location may be derived therefrom by suitable processing of the signal strength or amplitude of the detected ingress signal as indicated at 335 of FIG. 3.

The encoded information pulses 320 which are transmitted are preferably minimized to conserve energy and reduce transmission duty cycle since the transmitted signal can potentially cause interference with other wireless communications or communications over the cable communication system. Therefore, while not at all critical to the successful practice of the invention, the coded pulse transmissions are preferably limited to a duty cycle of 10% or less and are suspended when the vehicle is not in motion. The encoded pulses are also preferably transmitted at a repetition rate not greater than the GPS position reports 310 which are currently provided once per second for commercially available GPS systems which are considered to be economical and adequate for practice of the invention.

As will be discussed in greater detail below, it is preferred that a memory arrangement 315 adequate to store GPS locations and time stamps corresponding to each transmitted encoded pulse for a period of time generally corresponding to the system latency period is also provided in the vehicle. The memory arrangement is preferably provided in either the transmitter or GPS system. This memory arrangement is preferably in the form of a first-in-first-out (FIFO) buffer such that data may be discarded after a predetermined period of time, preferably on the order of several minutes.

At points where the cable communication system shielding is compromised as indicated at 120 of FIG. 1, energy from the transmitted encoded pulse enters (321) the otherwise secure (as indicated at 322) communication system 100 and is carried thereby to a suitable data processing location such as a distribution hub 130 or central "headend" facility 140 where it is detected and decoded, as depicted at 330 of FIG. 3, to determine the identity of the transmitter or vehicle which produced the detected pulse 321 and to apply a time stamp in accordance with a clock 331. (It should be noted in this regard that an ingress signal can be detected based solely on the frequency employed and, while desirable, successful decoding of an ID signal is not necessary to the practice of the invention. That is, in practice, the ID signal may be incomplete or corrupted by noise while the identification of the transmitter and its location can potentially be reconstructed solely from the ingress signal arrival time and known system signal propagation delays. Any degree of ambiguity in transmitter identification can be accommodated by generation of multiple wireless links as will be discussed below to each possible transmitter which could have transmitted the ingress signal. Thus initial unique identification of the transmitter merely serves to minimize the number of wireless links generated and the cost thereof.)

Once a (potential) transmitter or vehicle has been identified, it can be contacted through a wireless communication channel such as a cellular telephone device/link or the like (e.g. wireless internet, Wi-Fi, wireless messaging, etc. as depicted at 150, 160 of FIG. 1 and 340 of FIG. 3) in accordance with information supplied from, for example, look-up table 332 containing a mapping of identification codes to wireless receiver addresses to transmit information such as a time stamp or sequence number (which can be advantageously used to distinguish between ingress signal transmitters using very few transmitted bits since the sequence numbers of pulses of a sequence of pulses would not ordinary be closely synchronized between transmitters) that can be matched against the data stored in the FIFO memory arrangement discussed above. Upon such interrogation, the corresponding GPS location information corresponding to the detected energy pulse or a short list thereof can be returned to the data processing location over the same wireless link as depicted at 345 of FIG. 3 where processing 350 to find or confirm a match can be performed.

As a variant embodiment of the invention, the GPS location could be encoded and transmitted with each pulse either with or instead of the vehicle or transmitter identification information. In such a case, the wireless link communications 340, 345 could be omitted and the signal ingress location computed from the transmitted GPS signal. However, such an arrangement is not preferred since the ingress signal into the cable communication system occurs through a flaw and may be noisy or incomplete, particularly if the length of the GPS signal significantly increases the coded pulse duration while the speed of the vehicle tends to shorten the time the transmitter will be sufficiently proximate to the cable shielding flaw for the coded signal to enter the cable communication system.

On the other hand, providing additional processing capability (e.g. 350') in the vehicle to carry out the matching process fully may unduly increase the cost of deployment of the shielding flaw detection system in accordance with the invention. Accordingly, as will be discussed in greater detail below, the preferred arrangement is for the processing location 130, 140, upon detection of an ingress signal 321, to open a wireless communication link 340, 345 to the vehicle (or a number of vehicles if the identification information is incomplete, noisy or otherwise ambiguous) to query the memory arrangement 315 for a list of transmissions and corresponding GPS locations and to perform the searching of returned list(s) for detailed matching at the data processing location. When a match is found, it is then stored at the data processing location for future use such as refining the estimated location of the shielding flaw from other ingress signals and dispatching personnel and equipment to effect repairs. This preferred communication scenario thus minimizes both the amount of equipment necessary to practice the invention and, the duration of both the ingress signals and the wireless communication link during the initial phase of shielding flaw detection.

Referring now to FIGS. 2 and 3, a second phase of location of a shielding flaw incident to repair thereof will now be discussed. When a shielding flaw has been detected with a sufficient degree of confidence (and its location refined to the degree possible, if it is desired to do so) to justify issuance of a work order, the processing location or other convenient location 130, 140 of the cable communication system will issue a work order or the like for repairs to be made to correct the shielding flaw. Periodic reports of GPS location from repair equipment may be used to assign particular personnel and equipment based on proximity to the flaw. Repair schedules may also be altered depending on the apparent severity of the flaw as indicated by the detected signal amplitude as depicted at 335 of FIG. 3.

Upon arrival at the reported flaw location 205 or reported GPS location of the transmitter at the time of the detected pulse energy, the continued existence of the flaw is preferably confirmed by transmitting another coded pulse 355 from a mobile ingress transmitter which is preferably also provided in the dispatched repair vehicle 210. If detection of ingress signal energy is confirmed by detection of identification or other suitable code in the manner described above, that confirmation is preferably communicated to repair personnel through a wireless communication link 360 as described above (except that, in this case, the wireless communication link is preferably continuous whereas wireless communication link 340, 345 need only be momentary for a single query and response after initial "hand-shake" communications) the technician or repair personnel can then begin to refine the flaw location by a manual search using a hand-held ingress transmitter which is substantially similar to the ingress transmitter described above that is preferably attached to the vehicle except that the coded pulse output power is preferably continuously or incrementally variable. Of course, the same physical instrument having both fixed and variable power modes of operation could be used for both phases of shielding flaw detection but it is considered to be preferable to assure that an ingress transmitter is always present in the vehicle for general monitoring purposes and thus is preferably fixed thereto. Further, the hand-held ingress transmitter preferably has additional features other than the memory controlled by wireless communications thereto as will be described below in order to provide feedback information to the repair personnel and which will have no function during normal monitoring operation. Conversely, the in-vehicle ingress transmitter preferably includes an arrangement for suppressing or halting the transmission of pulses when it is not moving, as alluded to above and discussed in greater detail below which is contrary to and may complicate or contribute to incorrect operation of the device when operated in a hand-held mode where the coded pulse transmissions will desirably be substantially continuous or on demand under user control, regardless of motion. Therefore, use of separate specialized instruments is preferred.

Generally, to verify operability of the hand-held instrument 220, it is preferable to transmit a coded pulse from the hand-held instrument 220 as indicated at 360 of FIG. 3 using the identification code of the in-vehicle transmitter (which could also be used for the hand-held instrument) and checking for an acknowledgment over the wireless link to the vehicle. This assures that the hand-held instrument 220 is capable of correctly transmitting an ingress signal comparable to that transmitted by the in-vehicle transmitter during the flaw confirmation described above and can also be used to calibrate the signal strength of the hand-held transmitter. Alternatively or in addition thereto, transmissions from the hand-held transmitter can start from an initially low signal strength and increase in signal strength until detection is achieved as confirmed over the wireless link to either or both of the in-vehicle or hand-held wireless receiver. In this regard, it is preferred to establish a single wireless link to the in-vehicle wireless receiver and to relay (preferably at low power) the wireless communications received at the in-vehicle wireless receiver to the hand-held instrument 220 in order to avoid duplication of wireless links from the processing location. This procedure of increasing signal strength from a low level to a level sufficient for detectable ingress as well as calibration are desirable to keep the ingress signal strength coupled into the cable at a level which will not saturate or overload the laser(s) or repeater circuitry in the upstream signaling path in the cable communication system.

Once the hand-held instrument 220 is confirmed to be operating properly and coupling ingress signals to the cable communication system through the shielding flaw, the operator can begin to search for the shielding flaw. It should be appreciated that, while use of a directional antenna on the hand-held instrument 220 would be preferred, a directional antenna operating at the preferred signal frequency would be impractically large. Therefore, the search procedure is limited to inferring an increase in proximity to the shielding flaw from ingress signal strength. In general, signal strength of the ingress signal will increase as the hand-held instrument 220 is brought closer to the shielding flaw. However, the geometry of the shielding flaw may also induce some directionality of the coupling of the ingress signal thereto (and which would be further complicated by the radiation pattern of a directional antenna for the ingress signal). Therefore, while the search for the shielding flaw may follow an indirect and potentially tortuous path as depicted at 215 of FIG. 2.

During the search, the amplitude of the detected ingress signal is continuously monitored at the processing location 130 or 140 and a signal representative thereof is transmitted to the wireless receiver in the vehicle or hand-held instrument and preferably controls some signal which is perceptible to the technician or repair personnel such as an audible tone which increases in frequency or volume with increase of strength of the detected ingress signal or a visual display which provides a preferably graphic indication of detected ingress signal strength. At the same time, such a signal is preferably used to reduce the transmitted signal strength from the hand-held instrument 220 as may be desirable or necessary to avoid saturation or overload of the upstream signaling components of the cable communication system as well as to minimize interference with the operation thereof and other upstream or downstream signals that may be present in the system. Since the transmitted signal strength as well as the distance of transmission (e.g. the separation of the hand-held instrument from the shielding flaw) affects the detected ingress signal strength, it is preferable to compensate the display, audible tone or other perceptible signal to the technician or repair personnel in accordance with the signal strength actually transmitted from the hand-held instrument 220 to prevent or at least reduce unnatural changes in the perceptible signal when the transmitted signal strength is changed.

When the shielding flaw 120 is located by following increased levels of coupling of the transmitted ingress signal to the shielding flaw in a closed loop fashion, repairs can be effected. Efficacy of the repairs can be confirmed by again transmitting an ingress signal from the hand-held instrument 220 and, preferably, again from the in-vehicle ingress signal transmitter. Thereafter, the continued integrity of the repair can be monitored as discussed above in regard to the initial phase of system integrity monitoring illustrated in FIGS. 1 and 3.

While much of the functions of the in-vehicle ingress signal transmitter and the hand-held instrument have been described above, in the interest of completeness, preferred architectures of the in-vehicle transmitter and the hand-held instrument will now be discussed in connection with FIGS. 4 and 5, respectively. It should be understood that FIGS. 4 and 5 include only the elements which provide the above-described functionality and other structures could be included within the spirit and scope of the present invention. It should also be appreciated that, as alluded to above, the functional elements illustrated in FIGS. 4 and 5 include a number of similar elements which are common to both devices and, if desired, all such elements could be included, with appropriate controls and/or switching, in a single instrument.

Referring now to FIG. 4 the preferred architecture of an in-vehicle ingress signal transmitter 120 will now be discussed. The signal ingress transmitter 410 preferably operates at a radio frequency (RF) markedly different from the frequencies used for upstream signaling and in a markedly different portion of the RF spectrum that is used for downstream signaling in the cable communication system in order to facilitate detection. (It should be understood that an ingress signal will propagate throughout the cable segment containing the shielding flaw. However, cable segments are separated by repeaters and other active elements and it is common practice to include an active filter at each repeater or other active device. Therefore, ingress signals will only be allowed to propagate from cable segment to cable segment only in the upstream direction in the cable communication system which is assumed to also be in the direction of the data processing location alluded to above. However, other locations may be used for the data processing location as long as provision is made for the ingress signal to propagate thereto.) The radio frequency carrier frequency is modulated in accordance with an identification code supplied by element 420 (e.g. a memory or switch array) so that each such transmitter in use at any given time can be uniquely identified. As alluded to above, unique identification of a transmitter is not necessary if a complete identification code is not received but can be otherwise reconstructed; which reconstruction can be facilitated by use of a pulse sequence number (derived from a pulse counter 425) that may be shorter than the number of bits in the identification code and thus may be more likely to be correctly received. Transmission of ingress signal is preferably controlled by GPS receiver 440 such that pulses are only transmitted when the transmitter (e.g. carried in a vehicle) is in motion. When each ingress signal energy pulse (modulated by the ID code, sequence number and the like) is transmitted, the location determined by the GPS receiver is also provided to memory 430, preferably in the nature of a FIFO buffer. Storage of locations is preferably synchronized with transmissions of modulated pulses by clock 450.

The in-vehicle transmitter also preferably includes a wireless communication transmitter/receiver 460 to receive a query from the processing location when an ingress signal is detected and to return a response of one or more locations from the memory device (which may optionally include match processing) in response to such a query. Further, as alluded to above, the in-vehicle transmitter may also include a relay transmitter 470 to communicate with the hand-held instrument 220. It may also be desirable that the relay transmitter 470 include a receiver so that the ingress transmitter 410 can be actuated from the hand-held instrument 220. It should be understood that the GPS receiver 440, wireless transmitter/receiver 460 and relay transmitter 470 need not be physically integrated in the same unit with the ingress signal transmitter 410 but any or all of them may be stand-alone units merely connected to it.

Referring now to FIG. 5 a preferred architecture of a hand-held instrument 220 in accordance with the invention will now be discussed. Similarly to the in-vehicle transmitter described above, the hand-held instrument 220 includes a similar RF transmitter 410 and a source 520 of signals for modulating the RF signal transmitted therefrom. However, it may be desirable to provide for additional coded signals to be provided for indicating that repair procedures are being conducted and/or to identify the hand-held instrument with a shorter identification code sequence so that the RF transmissions may be more rapidly transmitted and the transmission made more nearly continuous. Also, similarly to the in-vehicle transmitter, the hand-held instrument also includes a receiver 530 for receiving wireless transmissions directly or, preferably, as relayed from relay transmitter 470. It may also be desirable to include a transmission capability complementary to the optional receiver mentioned above to provide for control of some operations of the in-vehicle transmitter 120 from the hand-held instrument 220.

Signals received by wireless/relay receiver 530 also include information regarding received ingress signal strength detected at the processing location as described above. This information is communicated to both a transmitted signal strength control element 540, preferably as a control signal to allow the processing location to separately control the transmitted egress signal power (to the exclusion of the hand-held instrument after initial transmitted signal strength adjustment as described above) to allow the actual strength of the ingress signal in the system to be maintained at an acceptably low level while variations of detected signal strength, corrected for controlled changes in transmitted signal strength are provided to annunciator 550 such as a display or audible tone generator to guide the technician or repair personnel to the shielding flaw.

In view of the foregoing, the invention provides a systematic closed-loop method and apparatus for detecting and locating shielding faults in a cable communication system using signal ingress while limiting the amplitude or power of the signal coupled from an external transmitter to the cable communication system to protect the cable system elements from becoming saturated or overloaded and avoiding interference with either downstream or upstream communications thereon. Accordingly, the system and method of the present invention provide an effective tool for cable system monitoring and maintenance even in the absence of characteristics of communicated signals which have facilitated detection of signal egress for similar purposes in the past.

While the invention has been described in terms of a single preferred embodiment, those skilled in the art will recognize that the invention can be practiced with modification within the spirit and scope of the appended claims.

The invention claimed is:

1. A method for locating shielding flaws in a cable communication system, said method comprising steps of monitoring amplitude of radio frequency signals ingressing into said cable communication system at a shielding flaw, said amplitude tending to vary with proximity of a transmitter to a location of said shielding flaw permitting said ingressing of radio frequency signals, communicating a perceptible signal to a user indicating said amplitude, and controlling signal strength of radio frequency signals transmitted for ingress into said cable communication system in accordance with said monitoring step to limit a level of said ingress signal in said cable communication system while compensating said perceptible signal for change of said signal strength of radio frequency signals transmitted for ingress into said cable communication system whereby said perceptible signal provides an indication of proximity of a transmitter of said radio frequency signals to said location of said shielding flaw permitting ingress.

2. The method as recited in claim 1, including the further step of transmitting a signal for ingress at a low signal strength and increasing signal strength until ingress is detected.

3. The method as recited in claim 2, including the further step of transmitting a signal for ingress at a signal strength substantially equal to a signal strength of another transmitter.

4. The method as recited in claim 1, including the further step of transmitting a signal for ingress at a signal strength substantially equal to a signal strength of another transmitter.

5. The method as recited in claim 1, including a further step of encoding said signal transmitted for ingress into said cable communication system.

6. The method as recited in claim 5, wherein said signal transmitted for ingress is encoded with information identifying a transmitter of said signal.

7. The method as recited in claim 1, wherein said controlling step includes transmitting a signal over a wireless link.

8. The method as recited in claim 1, further including monitoring of said cable communication system, said monitoring comprising steps of detecting a time of ingress of a signal transmitted by a radio frequency transmitter into said cable communication signal through a shielding flaw, interrogating said transmitter for a location of said transmitter at said time of ingress of said radio frequency signal.

9. The method as recited in claim 8, wherein said interrogating step includes transmission of an interrogation signal over a wireless link.

10. The method as recited in claim 8, further including a step of sending a reply in response to said interrogation step.

11. The method as recited in claim 10, wherein said reply includes results of matching a transmission time and transmission location of said signal transmitted for ingress into said cable communication system and a time of said detection of ingress of said signal into said cable communication system.

12. The method as recited in claim 10, wherein said reply includes a sequence of times and locations of transmissions of signals for ingress into said cable communication system.

13. The method as recited in claim 8, wherein said signal transmitted for ingress into said cable communication system is transmitted from a moving vehicle.

14. The method as recited in claim 8, wherein said signal transmitted for ingress into said cable communication system is a coded pulse.

15. The method as recited in claim 14, wherein said coded pulse contains transmitter identification information or pulse sequence information by which a transmitter can be identified.

16. The method as recited in claim 14, wherein said coded pulse has a duty cycle of 10% or less.

17. The method as recited in claim 1, wherein said step of monitoring amplitude of radio frequency signals is performed at a distribution hub or central facility of said cable communication system.

18. Apparatus for monitoring a cable communication system including a transmitter for transmitting a radio frequency signal for ingress into said cable communication system at a shielding flaw, position locating means for producing location information corresponding to transmission of said signal for ingress into said cable communication system at a shielding flaw, and means for controlling signal strength of said signal for ingress into said cable communication system responsive to a received signal indicating signal strength of an ingress signal in said cable communication system, and means for responding to an inquiry upon detection of signal ingress into said cable communication system by transmitting said location information.

19. The apparatus as recited in claim 18, wherein said means for responding to an inquiry includes means for transmitting a plurality of positions and times of transmissions of said radio frequency signal.

20. The apparatus as recited in claim 18, wherein said means for responding to an inquiry includes
    means for matching a location to a time indicated in said inquiry and transmitting a result of said matching.

21. The apparatus as recited in claim 18, wherein said position locating means is located at a distribution hub or central facility of said cable communication system.

22. Apparatus for locating a shielding flaw in a cable communication system, said apparatus including
    means for transmitting a signal for ingress into a cable communication system through said shielding flaw,
    means for controlling signal strength of said signal for ingress into a cable communication system responsive to a received signal indicating signal strength of an ingress signal in said cable communication system, and
    means for generating a signal perceptible to a user indicating signal strength of said ingress signal in said cable communication system and compensated for changes in signal strength due to changes in transmitted signal strength.

23. The apparatus as recited in claim 22, further including means for determining signal strength of an ingress signal, said means for determining signal strength being located at a distribution hub or central facility of said cable communication system.

* * * * *